US011217479B2

United States Patent
Ho et al.

(10) Patent No.: US 11,217,479 B2
(45) Date of Patent: Jan. 4, 2022

(54) MULTIPLE METALLIZATION SCHEME

(71) Applicant: Taiwan Semiconductor Manufacturing Company, Ltd., Hsinchu (TW)

(72) Inventors: Hsin-Ying Ho, Kaohsiung (TW); Fang-I Chih, Tainan (TW); Hui-Chi Huang, Zhubei (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 45 days.

(21) Appl. No.: 16/246,125

(22) Filed: Jan. 11, 2019

(65) Prior Publication Data

US 2020/0043784 A1 Feb. 6, 2020

Related U.S. Application Data

(60) Provisional application No. 62/712,902, filed on Jul. 31, 2018.

(51) Int. Cl.
*H01L 21/768* (2006.01)

(52) U.S. Cl.
CPC .. *H01L 21/76879* (2013.01); *H01L 21/76843* (2013.01); *H01L 21/76859* (2013.01); *H01L 21/76883* (2013.01)

(58) Field of Classification Search
CPC ......... H01L 21/76879; H01L 21/76883; H01L 21/76859; H01L 21/76843
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2006/0175289 A1* | 8/2006 | Jung | H01L 21/32134 216/57 |
| 2017/0338148 A1* | 11/2017 | Shusterman | H01L 23/53252 |
| 2018/0151442 A1* | 5/2018 | Tsai | H01L 21/31053 |

\* cited by examiner

*Primary Examiner* — Selim U Ahmed
*Assistant Examiner* — Evan G Clinton
(74) *Attorney, Agent, or Firm* — Slater Matsil, LLP

(57) ABSTRACT

A multiple metallization scheme in conductive features of a device uses ion implantation in a first metal layer to make a portion of the first metal layer soluble to a wet cleaning agent. The soluble portion may then be removed by a wet cleaning process and a subsequent second metal layer deposited over the first metal layer. An additional layer may be formed by a second ion implantation in the second metal layer may be used to make a controllable portion of the second metal layer soluble to a wet cleaning agent. The soluble portion of the second metal layer may be removed by a wet cleaning process. The process of depositing metal layers, implanting ions, and removing soluble portions, may be repeated until a desired number of metal layers are provided.

20 Claims, 12 Drawing Sheets

MULTIPLE METALLIZATION SCHEME

CROSS-REFERENCE TO RELATED APPLICATIONS

This application claims the benefit of U.S. Provisional Application No. 62/712,902 filed on Jul. 31, 2018, entitled "Multiple Metal Scheme in One Trench," which application is hereby incorporated herein by reference in its entirety.

BACKGROUND

With the sizes of the integrated circuits becoming increasingly smaller, the respective formation processes also become increasingly more difficult, and problems may occur where conventionally no problems will occur. For example, in the formation of Fin Field-Effect Transistors (FinFETs), the contact plugs to gates and source/drain regions become increasingly difficult to control.

Sometimes it might by advantageous to use multiple metal layers within contact holes to form contact plugs or metal lines. For example, some metals may offer superior conductive properties, but may be difficult to planarize. A combination of two or more metal layers within a single trench may be used. In such instances, the process of depositing each metal layer is expensive and it is difficult to achieve uniformity in the thicknesses layer-by-layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
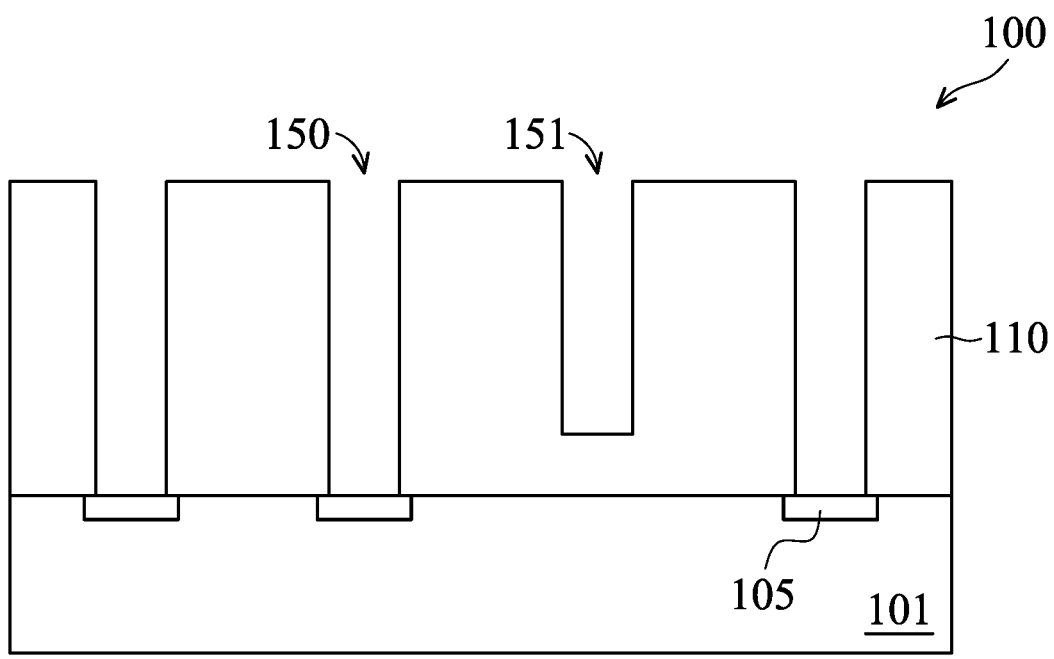
FIGS. 1 through 3, 4a, 4b, 4c, 5a, 5b, and 6 through 10 illustrate various views of intermediate stages of a multiple metallization scheme, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In filling trenches with a conductive material, for example in forming a conductor, such as a conductive plug to a target area, a conductive via to an underlying contact, or a conductive line, such as in an interconnect or redistribution structure, it may be desirable to use multiple metal types, referred to herein as a multiple metallization scheme. Multiple metal types might be desirable to use, for example, because multiple metals can be used to meet contact requirements at both ends of a conductor. As a bridge for electron transport, conductive features must have both good electrical conductivity and good compatibility with conductive materials which are in contact with the conductive features, for example, at each end of the conductive features. Two materials can be used to meet the requirements for contact at both ends. If three or more materials are available in a conductive feature, in addition to meeting the above conditions, the properties of the electron transport or other special applications can be adjusted by changing the intermediate conductive materials. Some processes that may be used to perform a multiple metallization scheme may result in different thicknesses of a same metal layer in different contacts. For example, a metal fill may be deposited in a trench and then dry etched back to provide room for a subsequent metal deposit of a different metal type. It may be difficult to dry etch back a uniform amount in multiple trenches simultaneously so that the first metal layer has the same thickness in each trench. In some cases for example, some processes which may be used to form a multiple metallization scheme may need a mask in the dry etch back to protect areas of the workpiece which should not be etched. In such processes, depositing and patterning a mask for each metal layer makes using a multiple metallization scheme resource intensive.

Embodiments provide a multiple metallization scheme which does not use a dry etch to etch back portions of a metal fill. As such, embodiment processes also do not require the use of multiple etch masks to form each metal layer. Embodiment processes use ion implantation techniques to implant ions into a portion of each deposited metal fill, which in turn causes the implanted portion of the metal fill to become, in effect, soluble, reactive, or more reactive to an appropriate solvent, cleaning agent, or wet etchant. For example, the implanted portion of the metal fill may be dissolvable by an appropriate solvent, may be made chemically reactive to a cleaning agent or etchant which it was not previously reactive to, or may be made more chemically reactive to a cleaning agent or etchant. By controlling the ion implantation depth, a controlled portion of the metal material of the metal fill can be treated, which is then removed without the need of repeated mask patterning processes. Once the ions are implanted in the metal, the ion implanted portions of the metal can be removed by a simple wet cleaning process. Following the removal of the ion containing portion of the metal fill to create a first metal layer, a subsequent metal fill can be deposited on the first metal layer. The process can be repeated. That is, a subsequent ion implantation may be performed and a portion of the second metal fill removed. The process may be repeated any number of times, for example, to form up to ten or more distinct metal layers in a multiple metallization scheme.

FIGS. 1 through 10 illustrate intermediate steps of a multiple metal scheme for forming multiple metal layers in a trench, in accordance with some embodiments. FIG. 1 illustrates a workpiece 100 having multiple trenches 150 formed in an insulating layer 110. One or more of the trenches 150 may expose an underlying target area 105 which is disposed in an underlying substrate 101. Workpiece 100 may include a wafer or a portion thereof.

Substrate 101 may include a non-metal material, including bulk silicon, amorphous silicon, single crystalized silicon, silicon oxide, silicon nitride, or the like. Substrate 101 may include another oxide, another nitride, or any suitable dielectric, such as an epoxy, a resin, a moldable polymer, polyimide, and the like. Target area 105 may be a contact pad; a conductive element of, for example, an underlying interconnect or underlying redistribution structure; a source/drain or gate electrode of a transistor, such as a Fin Field Effect Transistor (FinFET); and the like. In some embodiments, target area 105 may be a non-conductive material (e.g., a portion of substrate 101) which may be removed and replaced with a conductive material in a subsequent process.

Insulating layer 110 may be, for example, an interlayer dielectric (ILD) layer or intermetal dielectric (IMD) layer. In some embodiments, insulating layer 110 may be deposited by any suitable method, such as CVD, plasma-enhanced CVD (PECVD), FCVD, or spin-on. The material of insulating layer 110 may include any suitable insulating material (i.e., non-conductive or semi-conductive material), such as Phospho-Silicate Glass (PSG), Boro-Silicate Glass (BSG), Boron-Doped Phospho-Silicate Glass (BPSG), fluorosilicate glass (FSG), undoped Silicate Glass (USG), amorphous silicon, single crystalized silicon, carbon doped silicon, silicon germanium ($Si_xGe_{1-x}$, where x can be between approximately 0 and 1), pure germanium, silicon oxide, silicon nitride, or the like. The material of insulating layer 110 may also include another oxide, another nitride, or any suitable dielectric, such as an epoxy, a resin, a moldable polymer, polyimide, and the like. The material of insulating layer 110 may also include a low-k dielectric material, for example, with a k value less than or equal to about 3.0, or even less than or equal to about 2.5. Other insulating or semiconductor materials formed by any acceptable process may be used. In some embodiments, insulating layer 110 may be made of multiple layers of any combination of any of the candidate materials described above.

Trenches 150 may be formed in insulating layer 110 by any suitable method. For example, the trenches 150 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern trenches 150.

In some embodiments, trenches 150 may traverse completely through the insulating layer 110 and expose respective target areas 105 of substrate 101. In other embodiments, trenches 151 may be formed to partially traverse the insulating layer 110. In some embodiments, both trenches 150 and trenches 151 may be formed in the same insulating layer 110.

Figure 2:
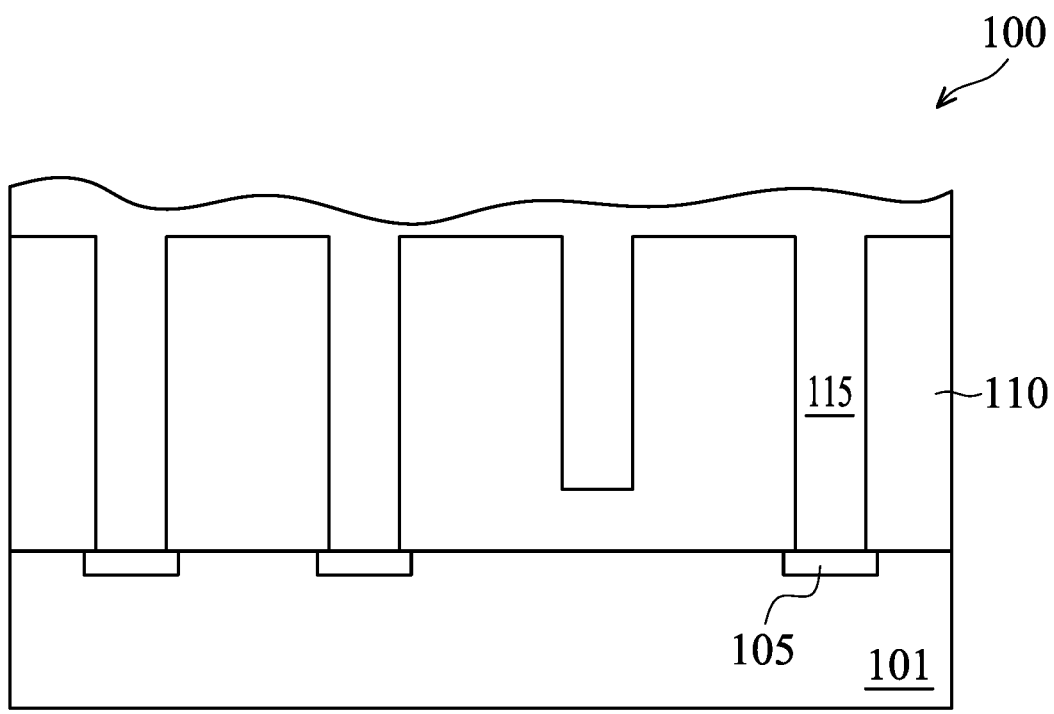

FIG. 2 illustrates a trench fill procedure, in accordance with some embodiments. A liner, such as a diffusion barrier layer, an adhesion layer, or the like, and a conductive material may be formed in the openings. The liner is discussed in further detail below with respect to FIG. 13. In some embodiments, a seed layer (not shown) may be deposited in the trenches. In such embodiments, the seed layer is a metal layer, which may be a single layer or a composite layer including a plurality of sub-layers formed of different materials, which may include, for example, titanium and/or copper, using, for example, PVD, ALD, CVD or the like.

Trenches 150 and trenches 151 may be filled with a first metal fill 115 by any suitable process, for example, through electro-plating, electro-less plating, PVD, CVD, or the like. Each metal fill described below may be made from any suitable candidate materials, which include W, Cu, Co, Al, Fe, Ti, Zr, Cr, Ni, Pt, Ag, Au, Zn, Ru, Hf, Ta, composites thereof, and other suitable metals. The metal fill 115 may overfill the trenches 150 and 151, such as illustrated in FIG. 2.

Figure 3:
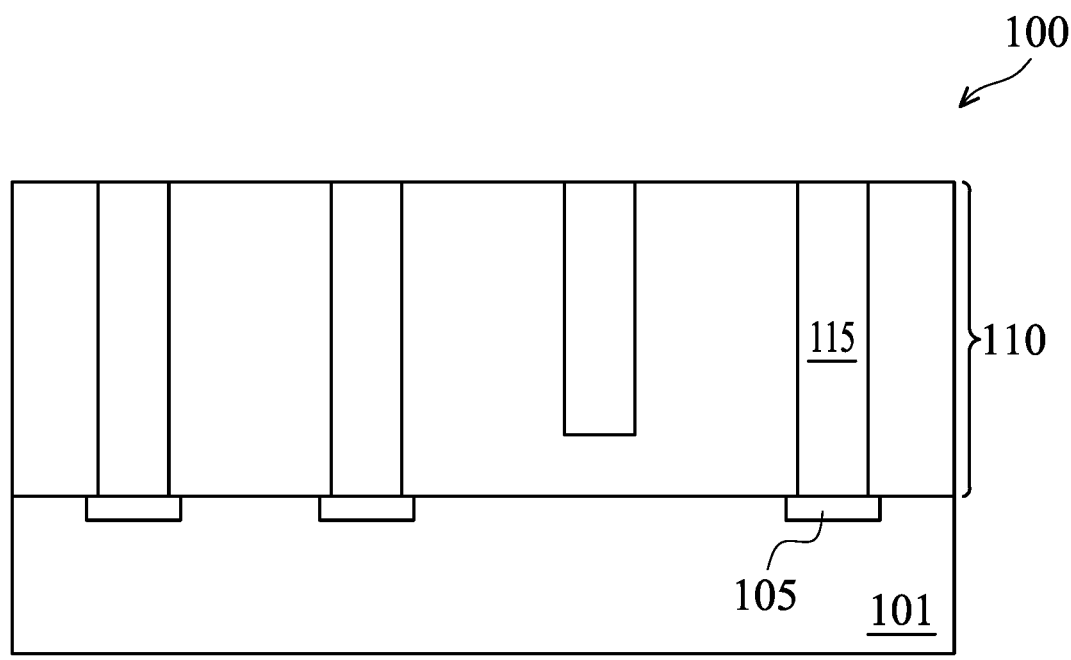

Referring to FIG. 3, a removal process is applied to the metal fill 115 to remove excess metal over the insulating layer 110. In some embodiments, the removal process may include a planarization process such as a chemical mechanical polish (CMP), an etch back process, combinations thereof, or the like may be utilized. The planarization process may level a top surface of the metal fill 115 with the top surface of the insulating layer 110, thereby separating the metal fill 115 into individual trenches 150 and/or trenches 151 (see FIG. 1).

Figure 4A:
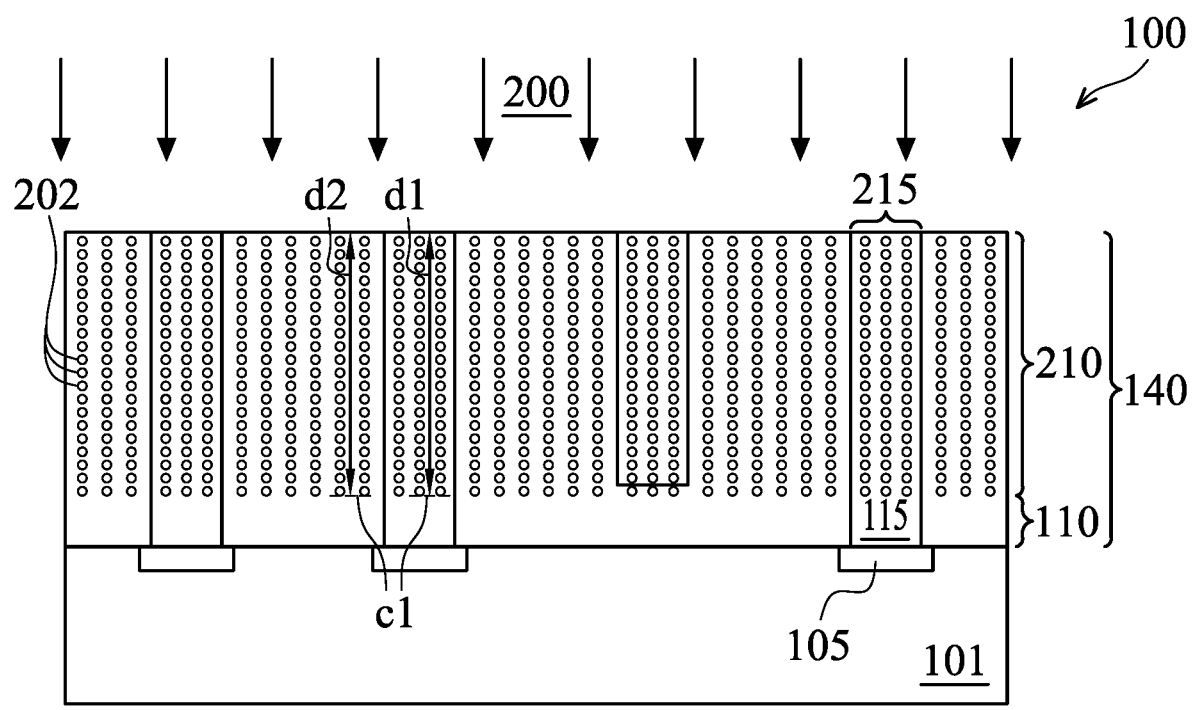
Figure 4B:
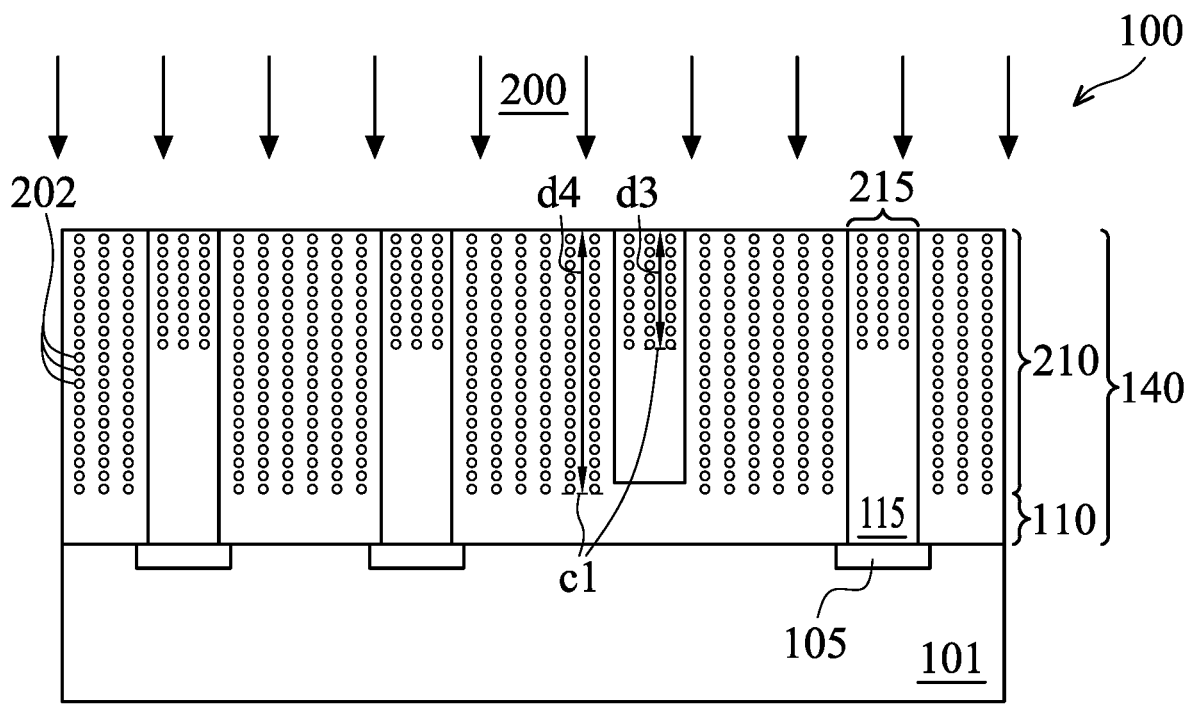
Figure 4C:
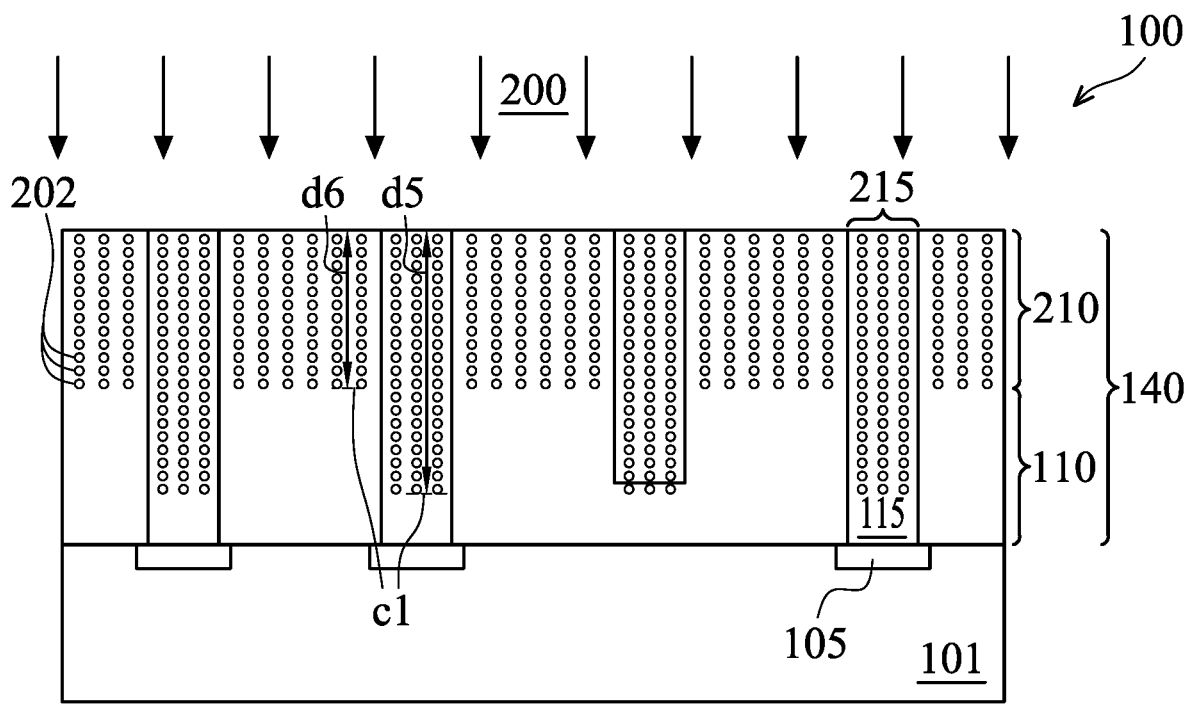

Referring to FIGS. 4a through 4c, an ion implantation process 200 is illustrated in accordance with some embodiments. The ion implantation process 200 implants ions 202 down to a controllable depth within the metal fill 115 and within the insulating layer 110. The ion implantation process 200 causes the affected portions of the metal fill 115, ion containing metal fill 215, to become soluble, reactive, or more reactive to a wet cleaning agent.

The species of ions 202 which may be used for the ion implantation process 200 may include one or more of P, B, N, As, C, Si, Ge, Ga, Cl, Br, F, I, $NO_3$, or the like. Other elements may be used as appropriate. The selection of which ions 202 to use may depend on the metal in which it is being implanted. For example, ion species which may be used in cobalt material may include P, F, I, Br, Cl, $NO_3$, or the like. As another example, ion species which may be used in aluminum material may include I, Br, Cl, $NO_3$, or the like. As a further example, ion species which may be used in copper material may include F, Br, Cl, $NO_3$, or the like.

In the ion implantation process 200, workpiece 100 may be placed in an ion implanting chamber (e.g., doping chamber) and ions are generated and implanted into workpiece 100. The process conditions which control the ion implantation may vary based on the material of the metal fill 115 and the ion species chosen for implantation. The depth of implant d1 into the metal fill 115 is controllable by the ion implantation energy, which may range, for example from about 10 keV to 80 keV. The ion implantation energy may be selected based on the material of the metal fill 115 and the ion species being implanted. For example, an ion implantation energy between about 1K eV and about 5K eV may be used to implant ions of the species P into the metal cobalt material to a depth between about 1 nm and about 3 nm. In addition, the depth d1 of ions 202 in the first ion implantation (for forming the first metallization layer in trenches 150 and/or trenches 151) is greater than the depth of ions in subsequent ion implantations (if any, as described in further detail below with respect to FIGS. 6 through 10).

The concentration of ions 202 for the ion implantation process 200 may range from about $1.0 \times 10^{13}$ ions/$cm^2$ to about $1.0 \times 10^{15}$ ions/$cm^2$, such as about $1.0 \times 10^{14}$ ions/$cm^2$, though other concentrations may be used and are contemplated. Generally, a higher concentration may be used to shorten implantation time. Implantation time in the ion implantation process 200 may range from about 5 seconds to about 600 seconds, such as about 120 seconds.

Other process variables for the ion implantation process 200 which may be manipulated to achieve a desired implantation result include temperature, pressure, tilt angle (i.e., implantation tilt angle), and mode. The temperature during the ion implantation process 200 may range from about −150° C. to about 300° C., such as about 100° C. Changing the process temperature affects the depth of implantation at a particular implantation energy with higher process temperatures resulting in greater implantation depth. The chamber pressure during the ion implantation process 200 may range from about $1.0 \times 10^{-6}$ torr to about $1.0 \times 10^{-5}$ torr, such as about $5.0 \times 10^{-5}$ torr. Chamber pressure affects ion dose with higher pressures providing higher doses of ions. The ion implantation tilt angle may range from 0 degree to 80 degrees from the vertical axis (see FIGS. 15 and 16). The ion implantation mode may range from 1 to 16 (see FIG. 17). Other values outside these ranges for the process conditions may be used, and are contemplated.

Still referring to FIG. 4a, after ion implantation, a portion of metal fill 115 has been implanted with ions 202 by the ion implantation process 200 to create ion containing metal fill 215 from the metal fill 115. The thickness of ion containing metal fill 215 corresponds to the depth d1 of the ion implantation. Depth d1 may be determined by the resulting ion concentration c1 at that depth, the ion concentration c1 being the minimum concentration of ions 202 necessary to achieve solubility of the ion containing metal fill 215. The value of ion concentration c1 will vary depending on the material of the metal fill 115, the species of ions 202, and the wet cleaning agent used (see FIG. 5a or 5b). For instance, in a nonlimiting example, a more aggressive wet cleaning agent, such as ammonia water, (29% by weight of $NH_3$) or HCl (hydrochloric acid, 37% by weight) would require less ion concentration c1, than a less aggressive wet cleaning agent, such as deionized water or aqueous $H_2O_2$ (hydrogen peroxide, 30%). The concentration c1 of ions 202 at depth d1 may generally be, for example, between about $1.0 \times 10^{18}$ atoms/$cm^3$ and about $1.0 \times 10^{22}$ atoms/$cm^3$, though other concentrations are contemplated.

Other factors may also affect the solubility or reactivity of the ion containing metal fill 215, such as the charges of the implanted ions. For example, an $ion^{+1}$ is not as reactive as an $ion^{+2}$ or $ion^{+3}$, and a greater distribution of more reactive ions will generally cause greater solubility or reactivity of the ion containing metal fill 215 to a wet cleaning agent at a particular ion concentration than a lesser distribution of more reactive ions at the same ion concentration. Concentration of ions 202 decreases deeper into the implantation such that ions 202 may be implanted into portions of metal fill 115 which are not soluble or reactive to the wet cleaning agent. At a certain ion concentration, the selected wet cleaning agent (discussed with respect to FIGS. 5a and 5b, below) will not effectively remove any of the metal fill 115, even though the metal fill 115 may still contain ions 202 at concentrations less than concentration c1. The depth d1 may be determined through the process of wet cleaning the ion containing metal fill 215, as described below.

The implanting of ions 202 in the metal fill 115 to create the ion containing metal fill 215 affects the material of metal fill 115 in several ways. Implanted ions 202 are generally positively charged (lacking electrons), causing the metal material in the ion containing metal fill 215 to be more chemically reactive. As such, implanted ions 202 may combine with the material of the metal fill 115 to form metal compounds. Also, as implanted ions 202 traverse through the metal fill 115 to their ultimate depth d1 they may physically alter the structure (e.g., lattice) of the metal fill 115 through collision forces and magnetic forces.

Similarly, a portion of the insulating layer 110 is also altered to form an ion containing insulating layer 210 from the insulating layer 110 (together, insulating layer 140). Because the material of the insulating layer 110 is different than the material of the metal fill 115, the thickness of the ion containing insulating layer 210 may be different than the thickness of the ion containing metal fill 215. The thickness of the ion containing insulating layer 210 corresponds to the depth d2 of the ion implantation in the insulating layer 110. Depth d2 may be determined by the concentration of ions 202 being about the same as the ion concentration c1 at that depth. In some embodiments, the depth d1 and the depth d2 may be the same or about the same. Referring to FIG. 4b, in some embodiments the depth d3 (or thickness) of the ion containing metal fill 215 may be less than the depth d4 (or thickness) of the ion containing insulating layer 210. Referring to FIG. 4c, in some embodiments the depth d5 (or thickness) of the ion containing metal fill 215 may be less than the depth d6 (or thickness) of the ion containing insulating layer 210. It should be understood that implanted ions 202 may implant beyond these depths (i.e., depth d2, depth d4, and depth d6), but that the depths described above indicate a depth where the concentration of ions falls below the threshold concentration c1. Unlike with the metal fill 115, however, the implantation of ions 202 into the insulating layer 110 will not make the ion containing insulating layer 210 soluble or reactive to the wet cleaning process described below.

Referring to FIGS. 4a and 4c, as illustrated in accordance with some embodiments, the ion containing metal fill 215 may traverse the whole of some of the trenches, such as trenches 151. The ions 202 may continue through such trenches to implant in the insulating layer 110 below such trenches.

Figure 5A:
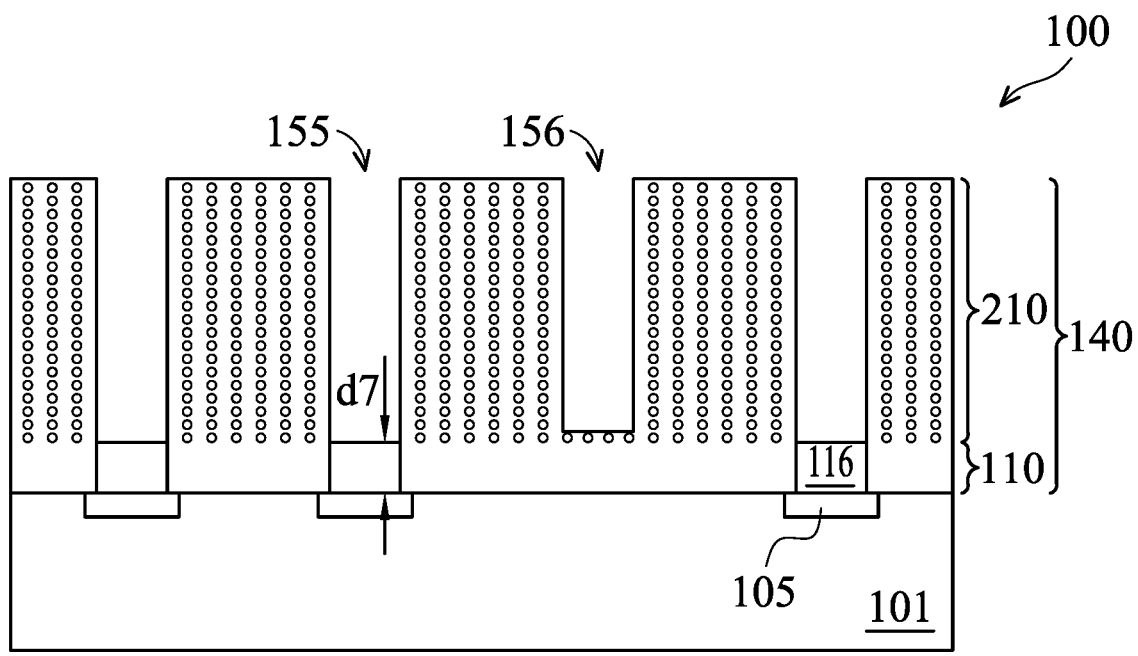

Referring now to FIG. 5a, a wet clean process is performed, which removes the portion of metal fill 115 which has implanted ions 202, that is, ion containing metal fill 215. Because the implanted ions 202 have altered the physical properties of a portion of the metal fill 115, the ion containing metal fill 215 may be removed using a simple cleaning process, such as a wet clean process. One advantage of using a wet clean process is that it may be performed without the need of a mask to protect the insulating layer 140.

The wet clean process may use any suitable wet cleaning agent. In some instances, some wet cleaning agents may be more effective than others based on the material of metal fill 115 and implanted ions 202 in the ion containing metal fill 215. Wet cleaning agents may include, for example, deionized water, ammonia water (0.1% to about 99.9% by weight of $NH_3$), hydrogen peroxide (0.1% to about 99.9% by weight of $H_2O_2$), aqueous hydrofluoric acid (0.1% to about 99.9% by weight of HF), aqueous hydrochloric acid (0.1% to about 99.9% by weight of HCl), aqueous sulfuric acid (0.1% to about 99.9% by weight of $H_2SO_4$), aqueous phosphoric acid or its derivatives (0.1% to about 99.9% by weight), or a mixture of two or more thereof. Other suitable chemicals can be used for the wet cleaning agent. The ion containing metal fill 215 may be exposed to the wet cleaning agent for a duration between about 5 seconds and about 600 seconds, though other durations may be used. For instance, in a nonlimiting example, the wet cleaning agent HCl (hydrochloric acid, 37% by weight) may be used for the metal cobalt material which is implanted with F ions.

In some embodiments, the wet cleaning agents may act as a solvent with respect to the ion containing metal fill 215, essentially dissolving the affected portion of the metal fill 115. In some embodiments, the wet cleaning agents may act as an etchant with respect to the ion containing metal fill 215, etching the affected portion of the metal fill 115. In such embodiments, in some cases the ion implantation may cause the ion containing metal fill 215 to become reactive with the wet cleaning agents where before the metal would not have been reactive with wet cleaning agents. In other cases, the ion implantation may cause the ion containing metal fill 215 to become more reactive with the wet cleaning agent, effectively increasing the etching rate of the wet cleaning agent. In such cases, for example, the etch rate may increase between about 2 and 100,000 times the prior etch rate. The ratio of the etch rate between the ion containing metal fill 215 and the ion containing insulating layer 210 may be between about 2:1 and about 1,000,000:1, whereas prior to the ion implantation the ratio of the etch rate between the material of metal fill 115 and the insulating layer 110 may be between about 2:1 and about 10,000,000:1.

Following the wet clean process removing the ion containing metal fill 215, a metal layer 116 remains in trenches 155, which are the remaining unfilled portion of trenches 150 (see FIG. 1), where metal layer 116 includes the material of metal fill 115. In each of trenches 155 (corresponding to trenches 150 which traverse the entire thickness of insulating layer 110, see FIG. 1), the thickness d7 of metal layer 116 is the difference of the thickness of insulating layer 140 and the implantation depth d1, d3, or d5 (see FIGS. 4a, 4b, and 4c) of ions 202 in metal fill 115. Because the ion implantation depth is controllable, the thickness d7 of metal layer 116 is advantageously substantially uniform in each of trenches 155. Having a uniform thickness of metal layer 116 in each of trenches 155 provides more uniform and predictable electrical effects in the resulting device, such as resistivity, leakage, capacitive coupling, and so forth.

In some embodiments, the metal layer 116 may have traces of the ion species of ions 202 formed therein. For example, in the ion implantation process 200, some ions 202 may achieve a greater depth than the intended ion implantation depth d1, d3, or d5 (see FIGS. 4a, 4b, and 4c). These ions 202, however, are at a concentration too low to affect the portion of metal fill 115 corresponding to metal layer 116 to make that portion of the metal fill 115 soluble or reactive to the wet cleaning agent.

In some embodiments, following the wet clean process, in trenches that do not completely traverse the insulating layer 110, such as trenches 151 (see FIG. 1), other effects of the wet clean process may be achieved. As illustrated in FIG. 5a, for example, in trenches 156 which correspond to trenches 151 of FIG. 1, the metal fill 115 is completely removed so that trenches 156 may not have a metal layer formed in the bottom thereof.

Figure 5B:
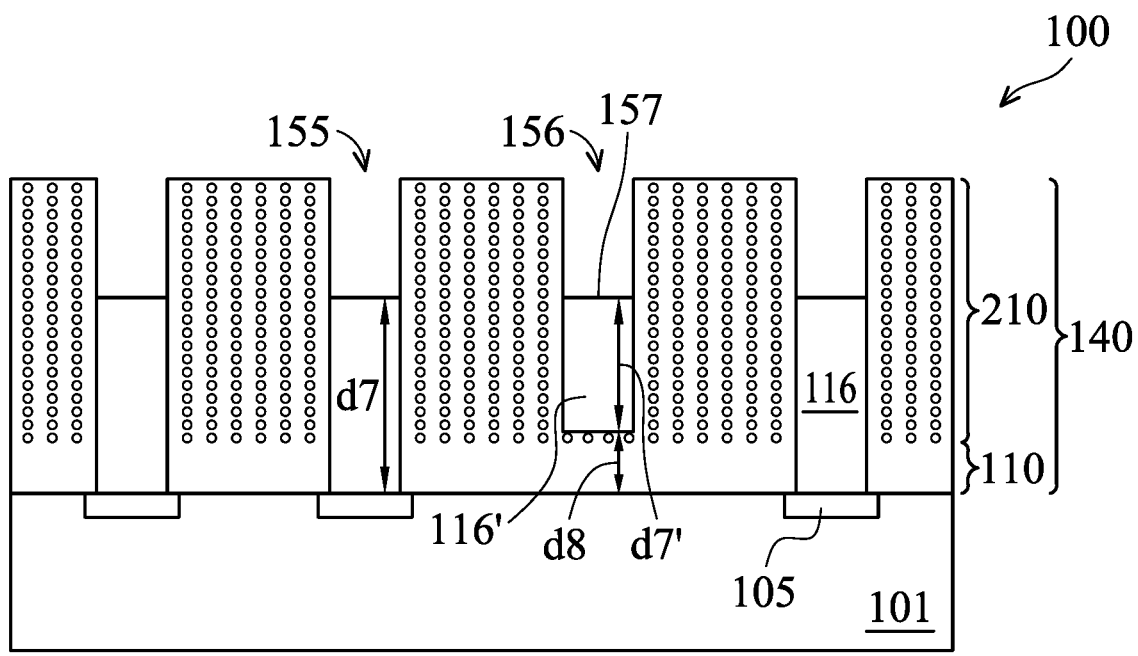

Referring to FIG. 5b, in other embodiments, for example following from FIG. 4b, a metal layer 116' may be formed in the bottom of trenches 156 which has a top surface 157 which is substantially level with the top surfaces 157 of metal layer 116 in trenches 155. However, the thickness d7' of the metal layer 116' in trenches 156 has a thickness which is different than the thickness d7 of metal layer 116 in trenches 155 by a difference of the distance d8, the thickness of the insulating layer 110 below the trenches 156 (see, e.g., FIG. 19).

Figure 6:
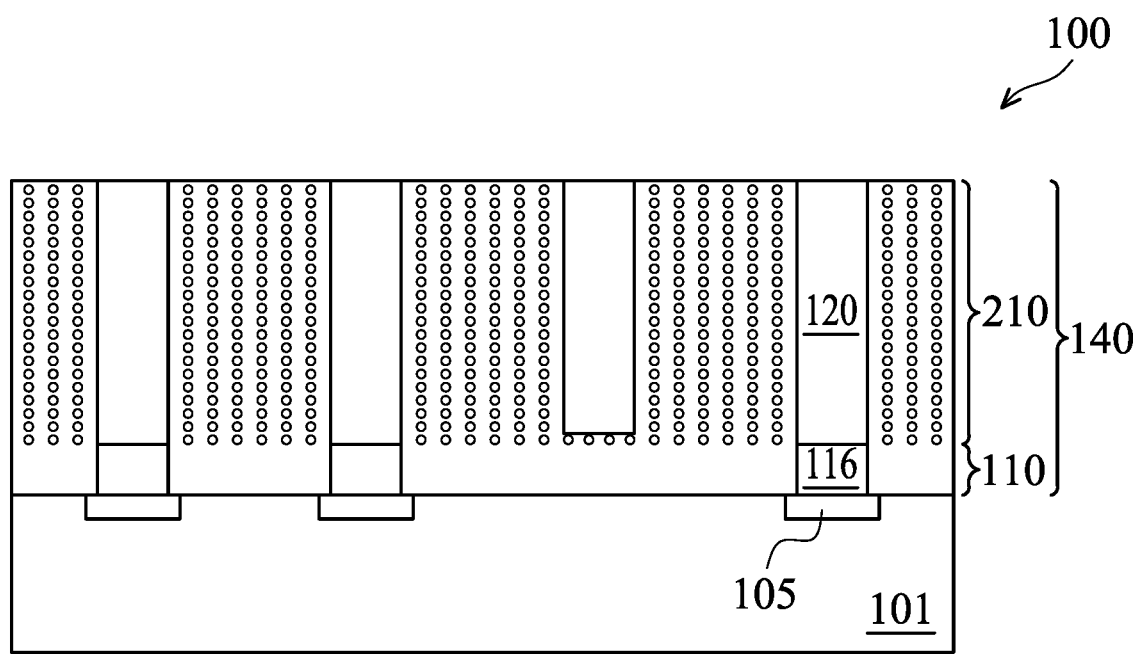

Referring now to FIG. 6, a trench fill procedure is illustrated, in accordance with some embodiments. The trench fill procedure may be performed using materials and processes such as those described with respect to FIG. 2, which are not repeated. Trenches 155 and trenches 156 (see FIG. 5a or 5b) are filled with another metal fill 120. It should be noted that the material of metal fill 120 may be different or the same as the material of metal fill 115. The trench fill procedure may use a liner layer and/or seed layer, such as noted above with respect to FIG. 2.

Still referring to FIG. 6, a removal process is applied to the metal fill 120 to remove excess metal over the ion containing insulating layer 210. In some embodiments, the removal process may be performed using processes such as those described above with respect to FIG. 3, thereby leveling a top surface of the metal fill 120 with the top surface of the ion containing insulating layer 210 and separating the metal fill 120 into individual trenches 155 and/or trenches 156 (see FIG. 5a or 5b).

Figure 18:
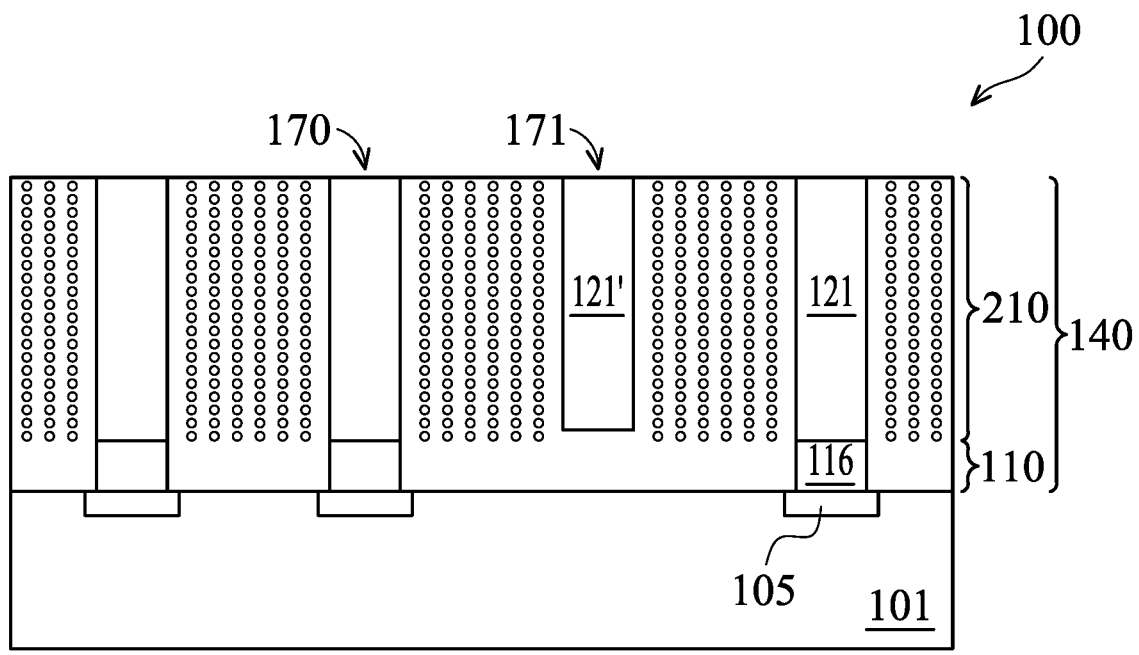
FIG. 18 illustrates various aspects of metal layers of a workpiece having conductive features formed therein using a multiple metallization scheme, in accordance with some embodiments.
Figure 19:
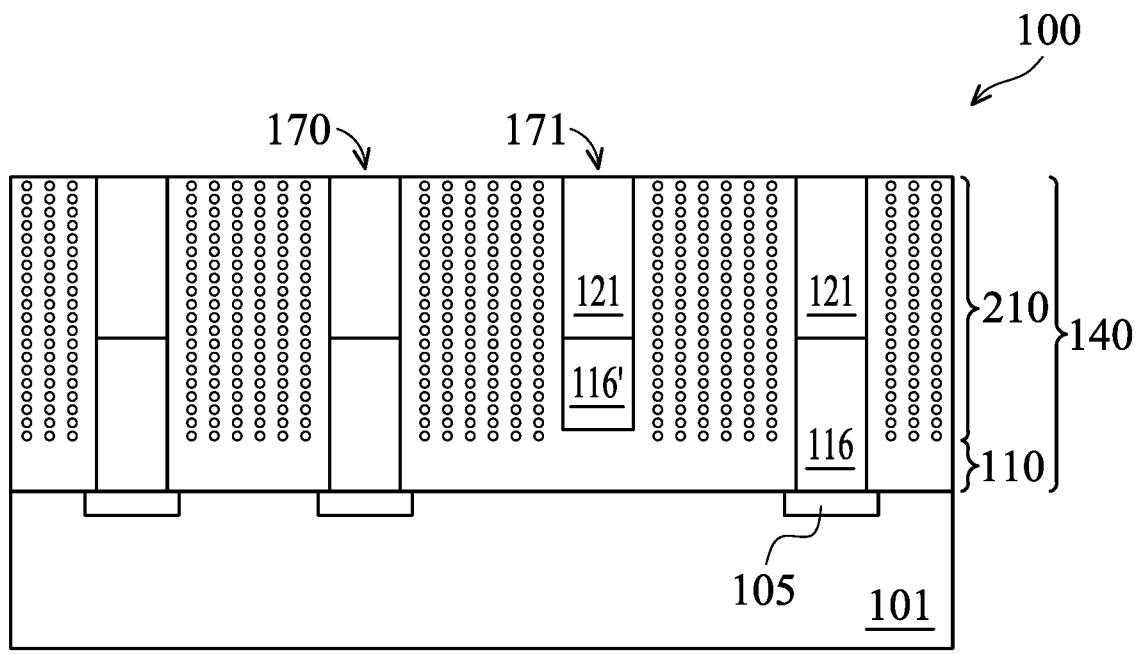
FIG. 19 illustrates various aspects of metal layers of a workpiece having conductive features formed therein using a multiple metallization scheme, in accordance with some embodiments.

In some embodiments, for example, such as where only two metal layers are formed in trenches 155 and/or trenches 156, the multiple metal scheme may be completed. Specific examples of embodiments having two metal layers are illustrated in FIGS. 18 and 19, discussed in greater detail below.

Referring to FIGS. 7 through 10, the ion implantation process of FIGS. 4a, 4b, and 4c, wet clean process of FIGS. 5a and 5b, and metal fill and removal process of FIG. 6 may be repeated until a desired number of meal layers is formed. For the purposes of illustration, another cycle of such processes is discussed in further detail below, however, one should understand that this cycle can be repeated any number of times to form a conductive structure having a desired multiple metallization scheme.

Figure 7:
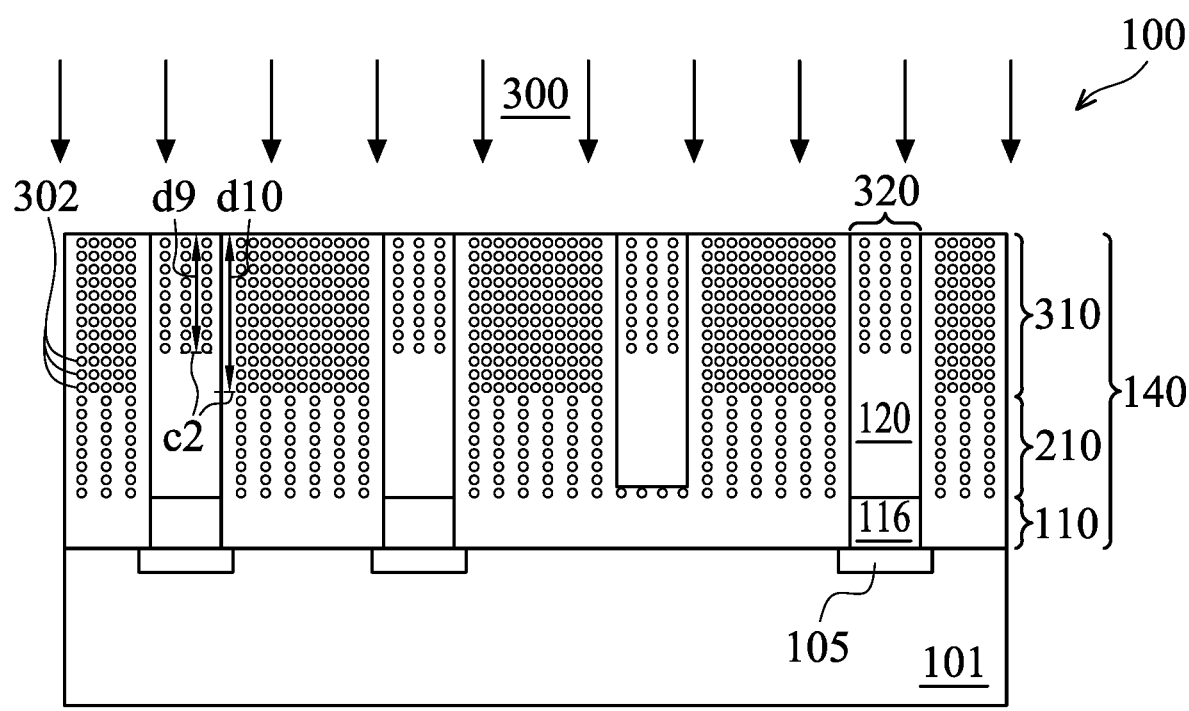

Referring to FIG. 7, an ion implantation process 300 is illustrated in accordance with some embodiments. The ion implantation process 300 is performed, implanting ions 302 down to a controllable depth within metal fill 120 and within the insulating layer 140. The ion implantation process 300 causes the affected portions of metal fill 120, ion containing metal fill 320, to become soluble, reactive, or more reactive to a wet cleaning agent.

The species of ions 302 which may be used for the ion implantation process 300 may include any of the species discussed above with respect to ions 202. The species of ions 302 may be the same as or different from the species of ions 202 (or species of ions 302 in a previous implantation cycle). The selection of which species of ions 302 to use can depend on the material of metal fill 120 in which ions 302 are being implanted.

In the ion implantation process 300, workpiece 100 is placed in an ion implanting chamber and ions 302 are generated and implanted into workpiece 100. The process conditions which control the ion implantation may vary based on the material of the metal fill 120 and the species of ions 302 chosen for implantation. The depth of implant d9 into the metal fill 120 is controllable by the ion implantation energy, which may range, for example from about 10 keV to 80 keV. The ion implantation energy may be selected based on the material of the metal fill 120 and the species of ions 302 being implanted. In addition, the depth d9 of implant of ions 302 in each subsequent implantation cycle (if any) is less than the depth of implant for the previous implantation cycle so that a remainder of the metal fill 120 is left behind in trenches 155 (see FIG. 5a or 5b).

In some embodiments, a remainder of the metal fill 120 may also be left behind in trenches 156, such as described below, however, in other embodiments, the material of metal fill 120 may be completely removed from trenches 156, depending on the depth of the trenches 156 and the implantation depth d9. For example, if the implantation depth d9 is greater than the depth of the trenches 156, then the material of metal fill 120 may be completely removed.

The ion implantation process 300 may have process variables and implantation conditions which are similar to those discussed above with respect to the ion implantation process 200, which are not repeated.

After ion implantation, a portion of metal fill 120 has been implanted with ions 302 forming ion containing metal fill 320 from the metal fill 120. The thickness of ion containing metal fill 320 corresponds to the depth d9 of the ion implantation. Depth d9 may be determined by the resulting implantation ion concentration c2 at that depth, the ion concentration c2 being the minimum concentration of ions 302 necessary to achieve solubility of the ion containing metal fill 320.

Similarly, a portion of the insulating layer 140 is also implanted with ions 302 to create an ion containing insulating layer 310. The cumulative insulating layers, such as insulating layer 110, ion containing insulating layer 210, and ion containing insulating layer 310 together may be referred to as insulating layer 140. Implantation depth d10 may be determined by the concentration of ions 302 being about the same as the ion concentration c2 at that depth.

In some embodiments, the implantation depth d10 is less than the implantation depth (e.g., depth d2 of FIG. 4a) of ions 202 in insulating layer 110 in ion implantation process 200. In such embodiments, the thickness of the ion containing insulating layer 310 corresponds to the depth d10 of the ion implantation in the ion containing insulating layer 210. For example, ion containing insulating layer 310 includes ions 302 and ions 202 and ion containing insulating layer 210 includes ions 202.

In other embodiments, for example if the implantation energy were greater in ion implantation process 300 versus ion implantation process 200, the implantation depth d10 of ions 302 may be greater than the implantation depth (e.g., depth d2 of FIG. 4a) of ions 202. In such embodiments, the ion containing insulating layer 210 may contain ions 302 and the ion containing insulating layer 310 may contain ions 202 and ions 302.

In some embodiments, the depth d9 and the depth d10 may be the same or about the same (e.g., similar to the depth d1 and the depth d2 discussed above with respect to FIG. 4a). In some embodiments the depth d9 may be less than the depth d10 (as illustrated in FIG. 7 and similar to the depth d3 and depth d4 discussed above with respect to FIG. 4b). In some embodiments, the depth d9 may be greater than the depth d10 (e.g., similar to the depth d5 and depth d6 discussed above with respect to FIG. 4c).

Figure 8:
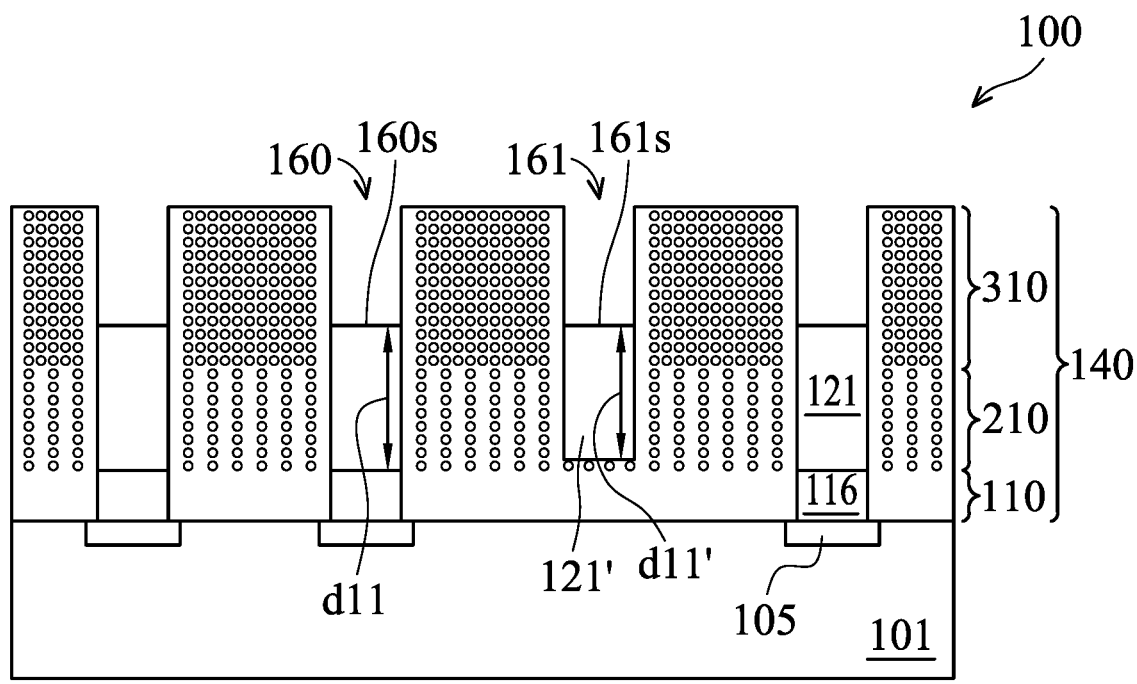

Referring now to FIG. 8, a wet clean process is performed, which removes the portion of metal fill 120 which has implanted ions 302, that is, ion containing metal fill 320. Because the implanted ions 302 have altered the physical properties of a portion of metal fill 120, ion containing metal fill 320 may be removed using a simple cleaning process, such as a wet clean process. One advantage of using a wet clean process is that it may be performed without the need of a mask to protect the insulating layer 140.

The wet clean process may use any suitable wet cleaning agent based on the material of metal fill 120 and implanted ions 302 in the ion containing metal fill 320. The wet clean process may use processes and materials such as those discussed above with respect to FIGS. 5a and 5b.

Following the wet clean process removing the ion containing metal fill 320, a metal layer 121 remains in trenches 160, which are the remaining unfilled portion of trenches 155 (see FIG. 5a or 5b), where metal layer 121 includes the material of metal fill 120. In each of trenches 160, the thickness d11 of metal layer 121 is the difference of the thickness of the metal fill 120 and the implantation depth d9 of ions 302. Because the ion implantation depth d9 is controllable, the thickness d11 of metal layer 121 is advantageously substantially uniform in each of trenches 160 and likewise has top surfaces 160s which are level in each of trenches 160. Having a uniform thickness of metal layer 121 in each of trenches 160 provides more uniform and predictable electrical effects in the resulting device, such as resistivity, leakage, capacitive coupling, and so forth.

In some embodiments, the metal layer 121 may have traces of the ion species of ions 302 formed therein. For example, in the ion implantation process 300, some ions 302 may achieve a greater depth than the implantation depth d9. These ions 302, however, are at a concentration too low to affect the portion of metal fill 120 corresponding to metal layer 121 to make that portion of the metal fill 120 soluble, reactive, or more reactive to the wet cleaning agent.

In some embodiments, following the wet clean process, in trenches that do not completely traverse the insulating layer 110 of FIG. 1, such as trenches 151 of FIG. 1, other effects of the wet clean process may be achieved. As illustrated in FIG. 8, for example, in trenches 161 which correspond to trenches 156 of FIGS. 5a and 5b, the metal fill 120 becomes the first metal layer 121' in trenches 161. Metal layer 121' may have a thickness d11' which is less than the thickness d11 of metal layer 121, however, the top surface 161s of metal layer 121' and top surface 160s of metal layer 121 are substantially level.

Figure 9:
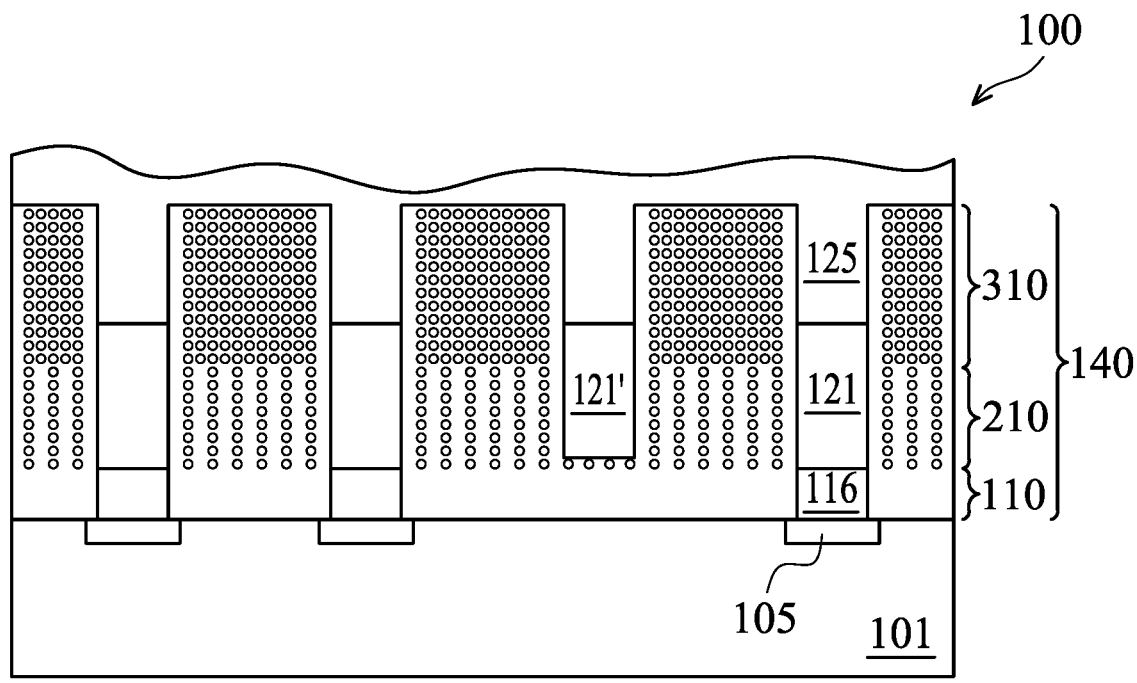

Referring now to FIG. 9, a trench fill procedure is illustrated, in accordance with some embodiments. The trench fill procedure may be performed using materials and processes such as those described with respect to FIG. 2, which are not repeated. Trenches 160 and trenches 161 (see FIG. 8) are filled with a third metal fill 125. It should be noted that the material of metal fill 125 may be different or the same as the material of any of the prior metal fills (e.g., metal fill 115 and/or metal fill 120). The trench fill procedure may use a liner layer and/or seed layer, such as noted above with respect to FIG. 2.

Figure 10:
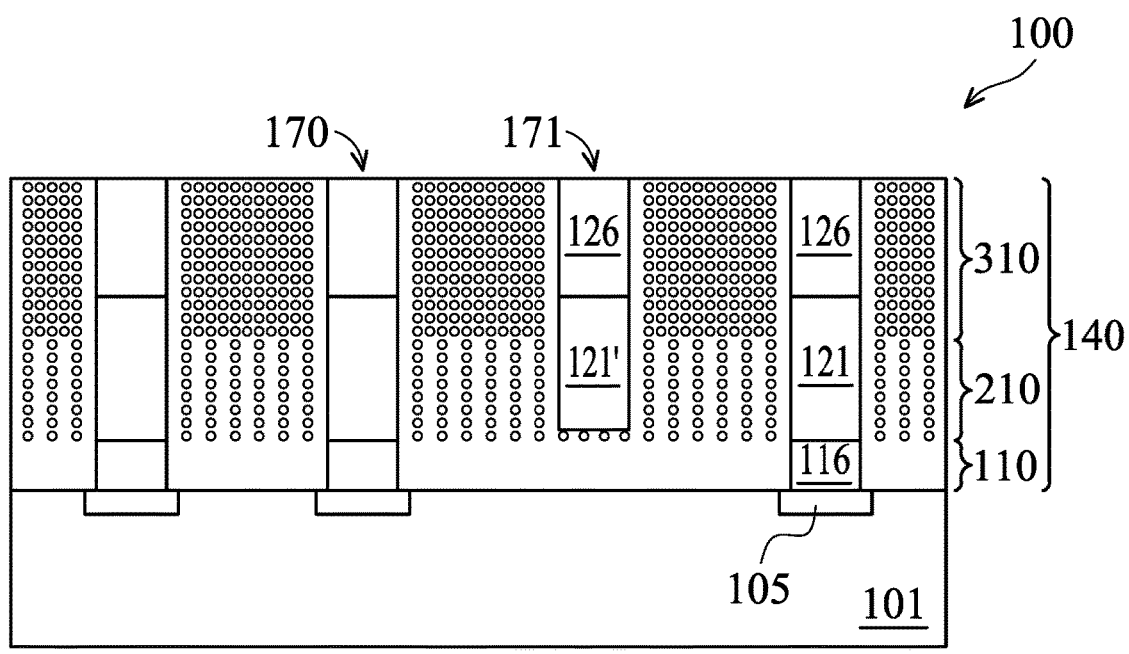

Referring to FIG. 10, a removal process is applied to the metal fill 125 to remove excess metal over the insulating layer 1400. In some embodiments, the removal process may be performed using processes such as those described above with respect to FIG. 3, thereby leveling a top surface of the metal fill 125 with the top surface of the insulating layer 140 and separating the metal fill 125 into individual trenches 160 and/or trenches 161 (see FIG. 8).

In some embodiments, the multiple metal scheme may be finished at this point, thereby forming conductive structures 170 and conductive structures 171 in a multiple metallization scheme. In other embodiments, the process described in FIGS. 7 through 10 may be repeated to form additional metallization layers in trenches 160 and/or trenches 161 (see FIG. 8).

Figure 11:
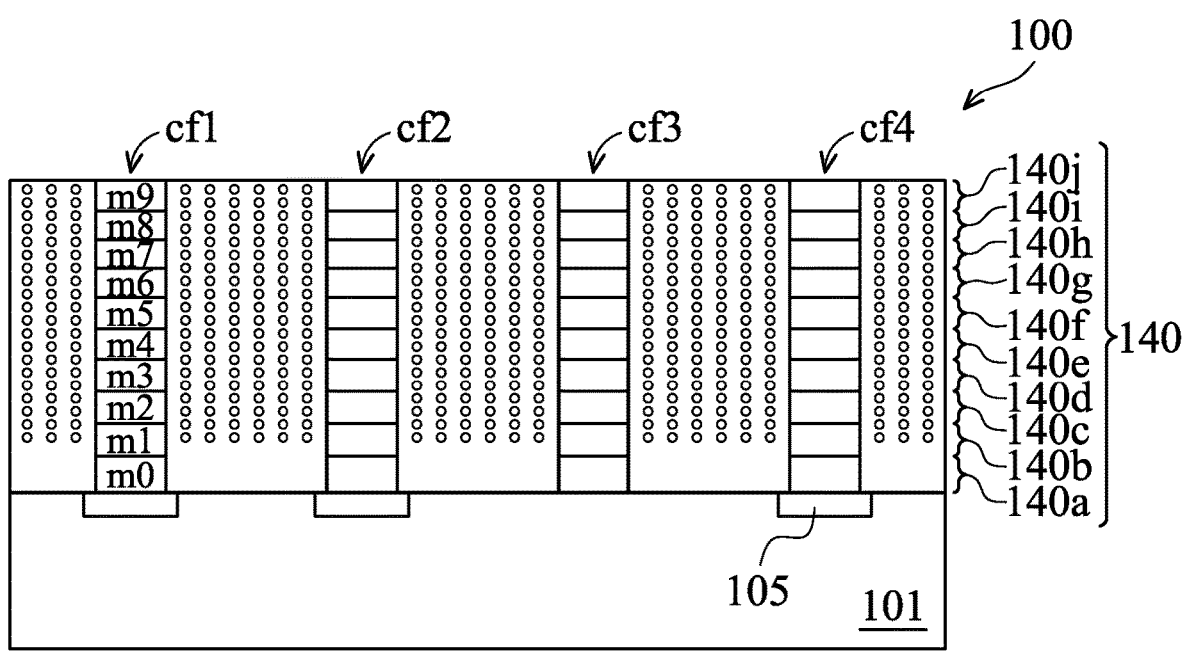
FIG. 11 illustrates various aspects of metal layers of a workpiece having conductive features formed therein using a multiple metallization scheme, in accordance with some embodiments.

Referring to FIG. 11, a device having a multiple metallization scheme is illustrated, in accordance with some embodiments. Four conductive features are illustrated, conductive feature cf1, conductive feature cf2, conductive feature cf3, and conductive feature cf4. Conductive features cf1, cf2, cf3, and cf4 each include metal layers m0 through m9, each of which may be made using the process described above, including multiple cycles of, for example, filling trenches with a metal fill, implanting ions in the metal fill, and removing the ion containing portion of the metal fill. Although 10 metal layers are illustrated, there may be a fewer or greater number of metal layers. Metal layers m0 through m9 are each illustrated as having the same thickness. Each of the conductive features cf1, cf2, cf3, and cf4 may be a via, a metal line, a portion of an interconnect, and so forth. The workpiece 100 illustrated in FIG. 11 may also have conductive features which do not, or which have portions which do not, completely traverse the insulating layer 140, such as illustrated in FIG. 10. Insulating layer 140 includes insulating layers 140a through 140j, which each may have one or more species of ions implanted therein.

Figure 12:
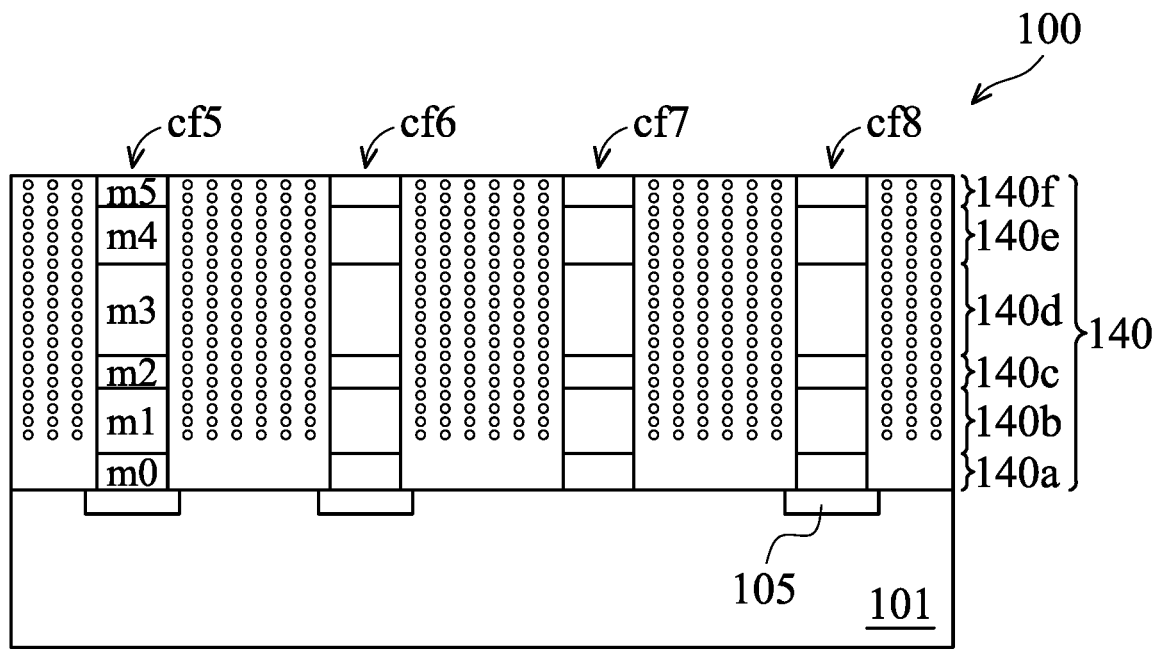
FIG. 12 illustrates various aspects of metal layers of a workpiece having conductive features formed therein using a multiple metallization scheme, in accordance with some embodiments.

Referring to FIG. 12, a multiple metallization scheme is illustrated, in accordance with some embodiments. Four conductive features are illustrated, conductive feature cf5, conductive feature cf6, conductive feature cf7, and conductive feature cf8. Conductive features cf5, cf6, cf7, and cf8 each include metal layers m0 through m5, each of which may be made using the process described above, including multiple cycles of, for example, filling trenches with a metal fill, implanting ions in the metal fill, and removing the ion containing portion of the metal fill. Although 6 metal layers are illustrated, there may be a fewer or greater number of layers. Metal layers m0 through m5 are each illustrated as having the same thickness in each respective layer of conductive features cf5, cf6, cf7, and cf8, but different thicknesses between the metal layers within one of the conductive features cf5, cf6, cf7, and cf8. Each of the conductive features cf5, cf6, cf7, and cf8 may be a via, a metal line, a portion of an interconnect, and so forth. The workpiece 100 illustrated in FIG. 12 may also have conductive features which do not, or which have portions which do not, completely traverse the insulating layer 140, such as illustrated in FIG. 10. Insulating layer 140 includes insulating layers 140a through 140f, which each may have one or more species of ions implanted therein.

Figure 13:
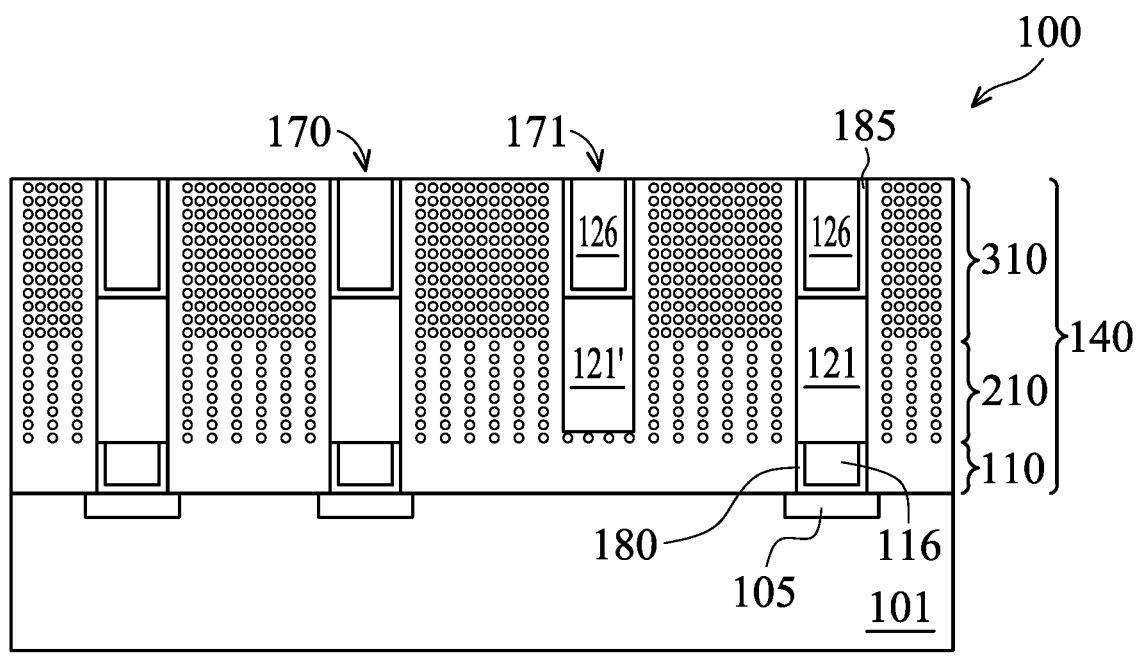
FIG. 13 illustrates various aspects of metal layers of a workpiece having conductive features formed therein using a multiple metallization scheme, in accordance with some embodiments.

Referring to FIG. 13, a multiple metallization scheme is illustrated, in accordance with some embodiments. FIG. 13 illustrates a view similar to that of FIG. 8, except that liner layer 180 and liner layer 185 are formed around metal layer 116 and metal layer 126, respectively. As discussed above with respect to FIGS. 2 and 6, when the metal fill 115, metal fill 120, metal fill 125, and so forth are formed, a liner layer, such as liner layer 180 or liner layer 185 may be used. Liner layers such as barrier layers may be used in metal layers on a layer-by-layer basis to inhibit material from the metal fills from leeching into the surrounding insulating layer 140. Since some metals may be more susceptible to leeching than others, a liner layer such as a barrier layer may be used for one metal layer, e.g., metal layer 116, but not for another metal layer, e.g., metal layer 121. Example materials for liner layers include one or more layers of titanium, titanium nitride, cobalt, ruthenium, silicon nitride, silicon oxide, silicon oxycarbonitride, hafnium oxide, zirconium oxide, silicon, the like, or combinations thereof. Liner layers may be deposited by any suitable process, such as by CVD, PVD, ALD, or the like.

Figure 14:
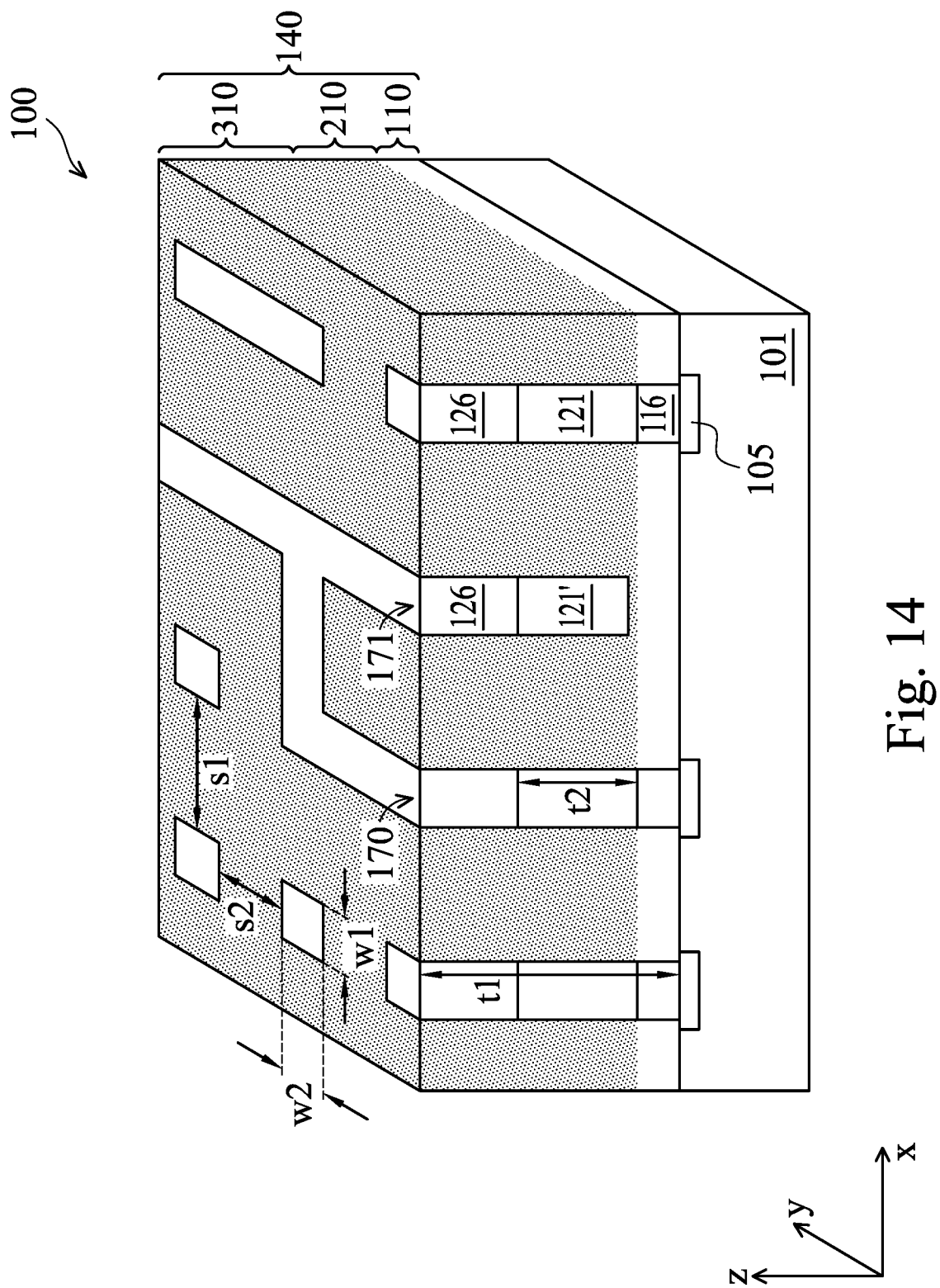
FIG. 14 illustrates a perspective view of various aspects of a workpiece having conductive features formed therein using a multiple metallization scheme, in accordance with some embodiments.

FIG. 14 illustrates a perspective view of a portion of a workpiece 100, in accordance with some embodiments. FIG. 14 illustrates another view of the workpiece 100 of FIG. 8, and illustrates various dimensions of the conductive structures, including conductive features 170 and conductive features 171, in accordance with some embodiments. The width w1 of the conductive structures in the x-direction and the width w2 of the conductive structures in the y-direction may range from 1 nm to 100 µm, for example, between about 1 nm and about 100 nm, such as about 30 nm. The spacing s1 between conductive structures in the x-direction or the spacing s2 between conductive structures in the y-direction may range from 1 nm to 500 µm, for example, between about 1 nm and about 50 nm, such as about 30 nm. Other dimensions may be used and are contemplated. The thickness t1 of the conductive structures in the z-direction may range from 1 nm to 500 µm, for example between about 1 nm and about 50 nm, such as about 40 nm. Other dimensions may be used and are contemplated. The thickness of any one metal layer of the conductive structures in the z-direction, for instance, the thickness t2, may range from less than 1 nm to about 499 µm, for example, between about 1 nm and about 10 nm, such as about 8 nm. Other dimensions may be used and are contemplated and may be selected on a layer-by-layer basis.

Figure 15:
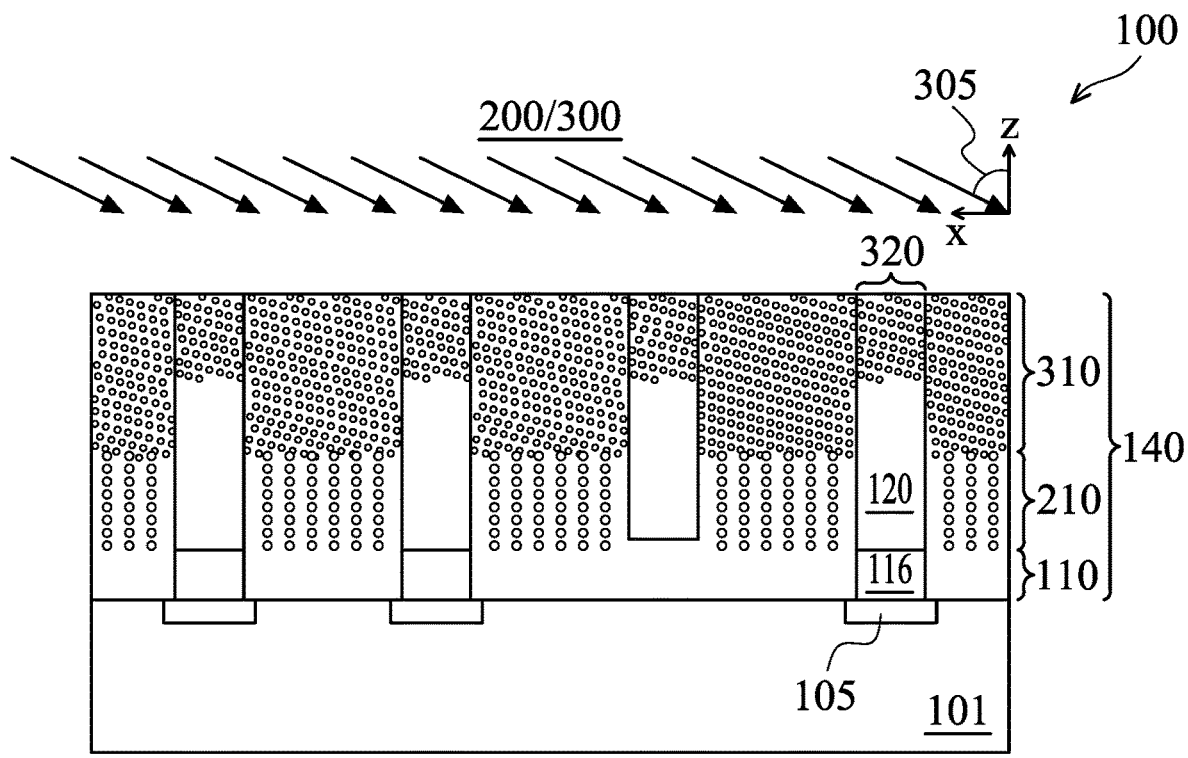
FIGS. 15 through 16 illustrate various aspects of ion implantation tilt angle of a workpiece having conductive features formed therein using a multiple metallization scheme, in accordance with some embodiments.
Figure 16:
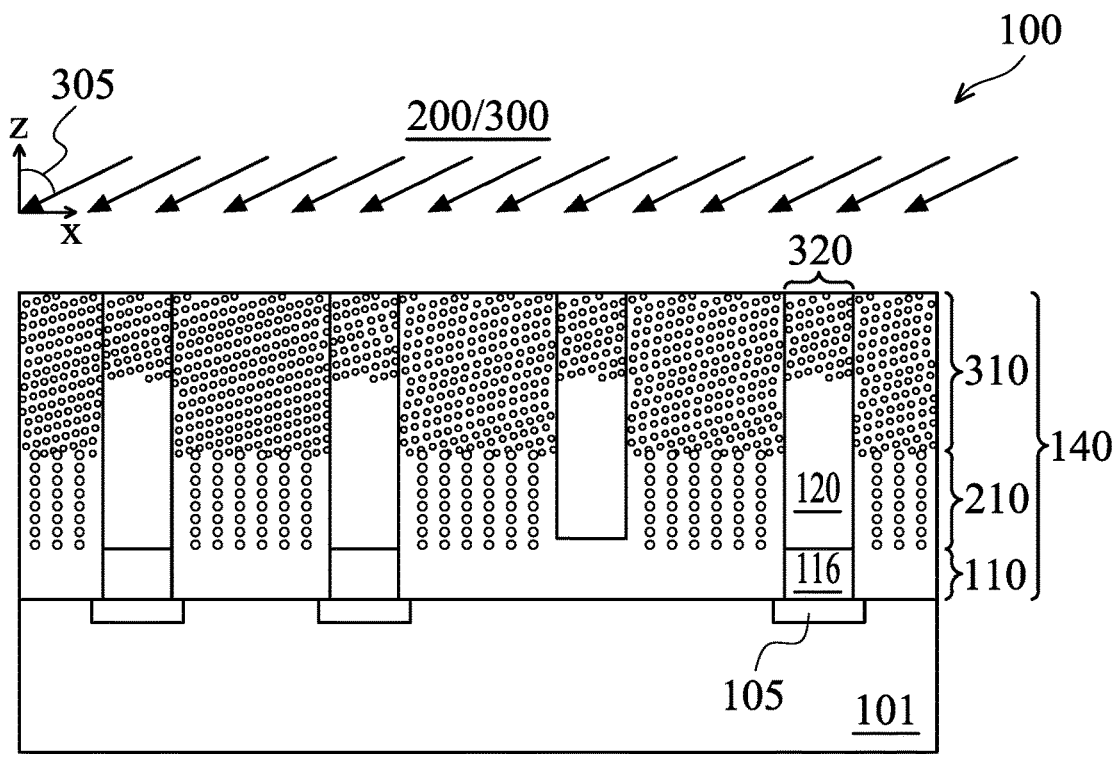
Figure 17:
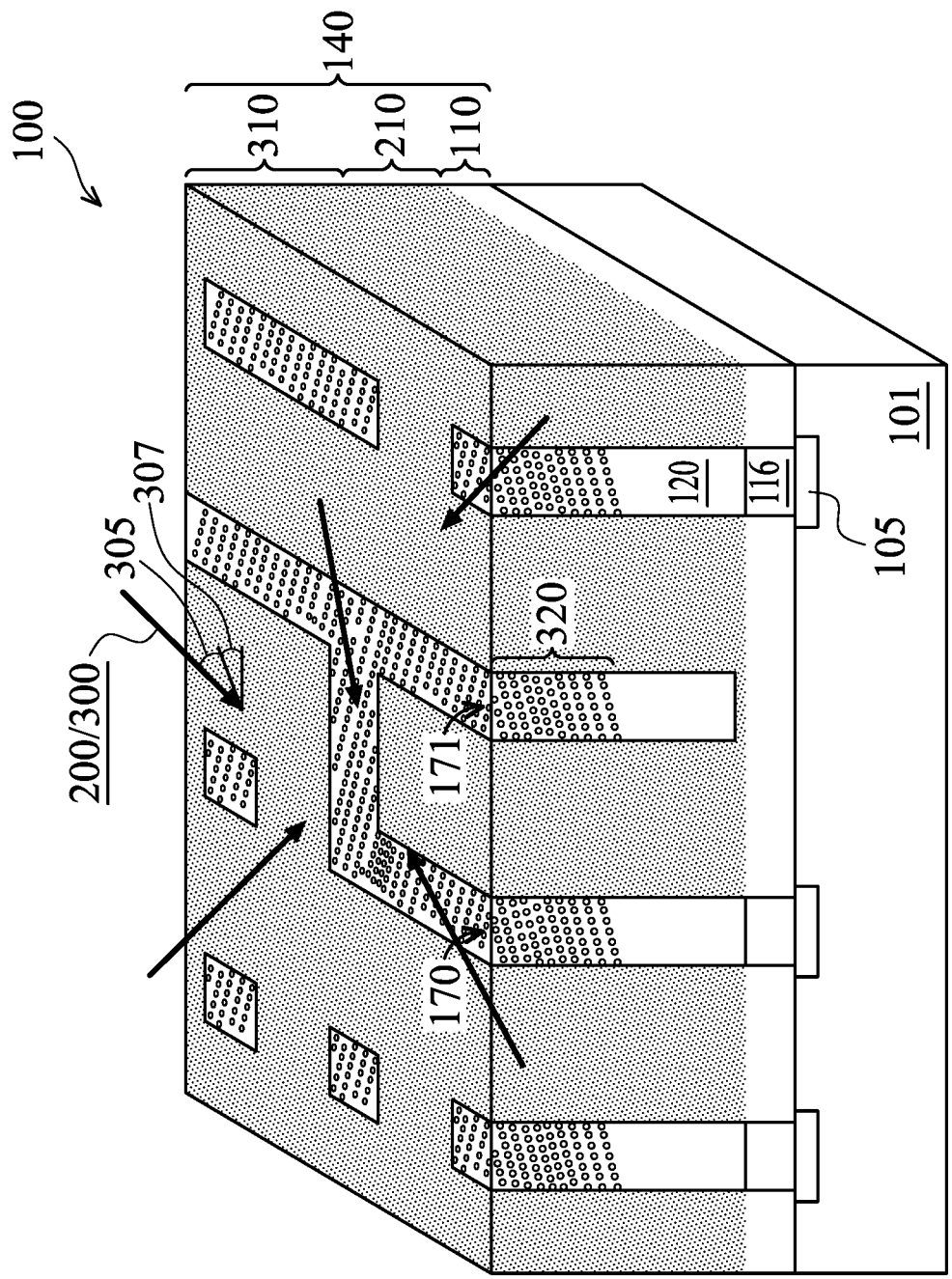
FIG. 17 illustrates a perspective view of various aspects of ion implantation tilt angle and mode of a workpiece having conductive features formed therein using a multiple metallization scheme, in accordance with some embodiments.

FIGS. 15 and 16 each illustrate implantation tilt angle 305 for ion implantation process 300 following the trench fill and subsequent removal process described above with respect to FIG. 6. One should understand, however, that implantation tilt angle 305 may also be altered with respect to the ion implantation process 200 of FIGS. 4a, 4b, and 4c. Each implantation process 200/300 may use one or more implantation tilt angles 305. Implantation tilt angle 305 may vary between 0 degrees and about 80 degrees from the z-axis. Implantation tilt angle may also rotate around the z-axis, as shown in FIG. 17, as discussed below. Different implantation tilt angles 305 may be desired, for example, because the target material being implanted into may have a crystalline structure. For example, an ion implanted into a crystalline material may travel further through interstitial areas of the crystalline structure. Using non-zero and different implantation tilt angles 305 increases the likelihood that an ion will interact with the material to slow and stop the ion at a particular depth.

FIG. 17 illustrates a perspective view of a portion of workpiece 100, in accordance with some embodiments. The view of workpiece 100 illustrated in FIG. 17 may, for example, be a perspective view of workpiece 100 of FIG. 15 or 16. Implantation mode refers to the number of different implantation angles used in a single implantation process. In some embodiments, implantation mode may range between 2 and 16. Some embodiments may have only one implantation mode or may have more than 16 implantation modes. Multiple implantation modes may be used simultaneously or may be performed one at a time. Implantation tilt angle 305 may also rotate around the z-axis by an angle 307, which may range from 0 through 360 degrees in the x-y plane.

FIG. 18 illustrates a workpiece 100 using a multiple metallization scheme, in accordance with some embodiments. FIG. 18 illustrates a case where a conductive feature 170 has two metal layers, metal layer 116 and metal layer 121, and where another conductive feature only has a single metal layer, metal layer 116', each formed using processes and materials described above. In cases where a trench (e.g., trench 151 of FIG. 1) does not traverse the entirety of the insulating layer 110, the ion implantation process 200 and subsequent cleaning process may remove the entire ion containing metal fill 215 (see, e.g., FIGS. 4a and 5a). After the second metal fill 120 is formed and leveled (see, e.g., FIG. 6), the conductive features 171 may have fewer metal layers (in this case only one metal layer 116') than the number of metal layers of the conductive features 170 (in this case, metal layer 116 and metal layer 121).

FIG. 19 illustrates a workpiece 100 using a multiple metallization scheme, in accordance with some embodiments. FIG. 19 illustrates a case where a conductive feature 170 has two metal layers, 116 and 121, and where another conductive feature also has two metal layers, 116' and 121, but where the thickness of metal layer 116' is less than the thickness of metal layer 116, each formed using processes and materials described above. In cases where a trench (e.g., trench 151 of FIG. 1) does not traverse the entirety of the insulating layer 110, the ion implantation process 200 and subsequent cleaning process may remove part of the metal fill 115 (see, e.g., FIGS. 4b and 5b). After the second metal fill 120 is provided and leveled (see, e.g., FIG. 6), the thickness of metal layer 116' of the conductive features 171 may be less than the thickness of the corresponding metal layer 116 of the conductive features 170. The concepts presented in FIGS. 18 and 19 may also be combined, for example, as illustrated in FIG. 10, so that conductive features 170 have three metal layers, metal layer 116, metal layer 121 and metal layer 126 and conductive features 171 have two metal layers, metal layer 121' and metal layer 126. Metal layer 121' corresponds to metal layer 121 (both coming from metal fill 120) but is thinner than metal layer 121, and metal layer 126 is the same in each of conductive features 170 and conductive features 171, both coming from conductive fill 125 and having the same thickness. Other variations are contemplated.

Embodiments advantageously provide a multiple metallization scheme in conductive structures of a device which uses ion implantation in a first metal fill to make a portion of the first metal fill soluble, reactive, or more reactive to a wet cleaning agent. The affected portion may then be removed by a wet cleaning process to form a first metal layer from the first metal fill. A subsequent second metal fill may then be deposited over the first metal layer. A second metal layer may be formed by using ion implantation in the second metal fill to make a controllable portion of the second metal fill soluble, reactive, or more reactive to a wet cleaning agent. The affected portion of the second metal fill may be removed by a wet cleaning process to form the second metal layer. The process of depositing metal layers, implanting ions, and removing affected portions may be repeated until a desired number of metal layers are formed. This process advantageously avoids the formation of etch masks at each etching step which would be needed to protect the material surrounding the metal layers, such as an insulating material from etchants. This process also advantageously provides that each metal layer may reliably have the same respective thickness in each conductive structure.

One embodiment is a method including depositing a first metal in a trench formed in a first material, implanting first ions into a first portion of the first metal, performing a wet clean to remove the first portion of the first metal, and depositing a second metal in the trench.

Another embodiment is a method including forming a first trench and second trench in a substrate. A first metal fill is deposited in the first trench and in the second trench. First ions are implanted in the first metal fill to a first depth in each of the first trench and the second trench, where the first depth is less than a first thickness of the first metal fill in the first trench. A wet clean is performed to remove an ion containing portion of the first metal fill from the first trench and the second trench, where a first metal layer of the first metal fill remains in the first trench and a second metal layer of the first metal fill remains in the second trench, where a top surface of the first metal layer is level with a top surface of the second metal layer. A second metal fill is deposited in the first trench over the first metal layer and in the second trench over the second metal layer.

Another embodiment is a device including a target area of a substrate and a first material layer over the substrate, the first material layer having one or more ion species implanted therein. The device also includes a conductive structure disposed within the first material layer over the target area, where the conductive structure includes two or more metal layers, where the conductive structure is electrically coupled to the target area, and where the one or more ion species of the first material layer are disposed in the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
depositing a first metal in a first trench in a substrate and in a second trench in the substrate;
performing a first planarization process to remove a portion of the first metal overfilling the first trench and the second trench;

implanting first ions into the first metal in each of the first trench and the second trench, wherein a first depth of the implanted first ions is less than a first thickness of the first metal in the first trench, the implanted first ions extending deeper than the first depth;

performing a first wet clean to remove the first depth of the first metal from the first trench and the second trench, a first metal layer of the first metal remaining in the first trench and a second metal layer of the first metal remaining in the second trench, wherein a top surface of the first metal layer is level with a top surface of the second metal layer; and depositing a second metal in the first trench over the first metal layer and in the second trench over the second metal layer, a first metallization layer of an interconnect comprising the first metal layer, the second metal layer, and a first interface between the first metal layer and the second metal layer, the first interface of the first metallization layer extending within the first trench from a first contact in the substrate to a second contact in the substrate.

2. The method of claim 1, further comprising:
performing a second planarization process after depositing the second metal.

3. The method of claim 1, further comprising:
implanting second ions into the second metal in each of the first and second trench;
performing a second wet clean to remove an ion containing portion of the second metal; and
depositing a third metal in the first trench and in the second trench.

4. The method of claim 1, wherein implanting the first ions into the first metal also implants the first ions into the substrate surrounding the first trench and the second trench.

5. The method of claim 4, wherein the first depth of the first ions implanted in the first metal is different than a second depth of the first ions implanted in the substrate.

6. The method of claim 1, wherein the first metal and second metal are selected from W, Cu, Co, Al, Fe, Ti, Zr, Cr, Ni, Pt, Ag, Au, Zn, Ru, Hf, or Ta.

7. The method of claim 1, wherein the first ions are selected from P, B, N, As, C, Si, Ge, Ga, Cl, Br, F, I, or $NO_3$.

8. The method of claim 1, further comprising:
prior to depositing the first metal or prior to depositing the second metal, forming a barrier layer in the first trench.

9. The method of claim 8, wherein a material of the barrier layer is selected from titanium, titanium nitride, cobalt, ruthenium, silicon nitride, silicon oxide, silicon oxycarbonitride, hafnium oxide, zirconium oxide, silicon, or combinations thereof.

10. The method of claim 1, wherein the substrate is an insulating layer comprising a nitride, oxide, or dielectric material.

11. A method comprising:
forming a first trench and second trench in a substrate;
depositing a first metal fill in the first trench and in the second trench;
implanting first ions into the first metal fill in each of the first trench and the second trench, wherein a first depth of the implanted first ions is less than a first thickness of the first metal fill in the first trench, the implanted first ions extending deeper than the first depth;
performing a first wet clean to remove the first depth of the first metal fill from the first trench and the second trench, a first metal layer of the first metal fill remaining in the first trench and a second metal layer of the first metal fill remaining in the second trench, wherein a top surface of the first metal layer is level with a top surface of the second metal layer; and depositing a second metal fill in the first trench over the first metal layer and in the second trench over the second metal layer, a first metallization layer of an interconnect comprising the first metal layer, the second metal layer, and a first interface between the first metal layer and the second metal layer, the first interface of the first metallization layer extending within the first trench from a first contact in the substrate to a second contact in the substrate.

12. The method of claim 11, wherein a thickness of the first metal layer is different than a thickness of the second metal layer.

13. The method of claim 12, further comprising:
implanting second ions into the second metal fill in the first trench and in the second trench; and
performing a second wet clean to remove an ion containing portion of the second metal fill from the first trench and the second trench, a third metal layer of the second metal fill remaining in the first trench and a fourth metal layer of the second metal fill remaining in the second trench, the third metal layer and fourth metal layer having a same thickness.

14. The method of claim 13, wherein the first ions and the second ions are a same ion species.

15. A device comprising:
a target area of a substrate;
a first dielectric material layer of an interconnect over the substrate, the first dielectric material layer comprising a first ion species implanted in a first thickness of the first dielectric material layer and a second ion species implanted in a second thickness of the first dielectric material layer, the first thickness being greater than the second thickness; and
a conductive structure disposed within the first dielectric material layer over the target area, the conductive structure electrically coupled to the target area, the first ion species disposed in a first metal layer of the conductive structure, the second ion species disposed in a second metal layer of the conductive structure over the first metal layer, the second metal layer of the conductive structure free from the first ion species, and a third metal layer of the conductive structure disposed over the second metal layer, the third metal layer free from the first ion species and the second ion species, wherein an upper surface of the conductive structure is level with an upper surface of the first dielectric material layer.

16. The device of claim 15, wherein the first ion species or the second ion species include one or more of P, B, N, As, C, Si, Ge, Ga, Cl, Br, F, I, or $NO_3$.

17. The device of claim 15, further comprising:
a barrier layer surrounding one or more of the first metal layer, the second metal layer, or the third metal layer.

18. The device of claim 15, wherein the first metal layer comprises a first material and the second metal layer comprises a second material, wherein the first material is different than the second material, wherein the first material and second material are selected from W, Cu, Co, Al, Fe, Ti, Zr, Cr, Ni, Pt, Ag, Au, Zn, Ru, Hf, or Ta.

19. The device of claim 15, wherein the conductive structure is a first conductive structure, the device further comprising a second conductive structure, wherein the second conductive structure has at least one identical metal layer as the first conductive structure, wherein each identical metal layer has a same thickness and material as a corresponding metal layer of the first conductive structure.

20. The device of claim 15, wherein the first thickness of the first dielectric material layer and the second thickness of the first dielectric material layer have an overlapping portion of the first dielectric material layer included in both the first thickness and the second thickness.

* * * * *